(12) United States Patent
NakaMats

(10) Patent No.: US 11,525,277 B2
(45) Date of Patent: Dec. 13, 2022

(54) STRUCTURES AND METHODS FOR LUNAR UTILIZATION

(71) Applicant: Yoshiro NakaMats, Tokyo (JP)

(72) Inventor: Yoshiro NakaMats, Tokyo (JP)

( * ) Notice: Subject to any disclaimer, the term of this patent is extended or adjusted under 35 U.S.C. 154(b) by 0 days.

(21) Appl. No.: 17/147,712

(22) Filed: Jan. 13, 2021

(65) Prior Publication Data

US 2021/0317677 A1 Oct. 14, 2021

Related U.S. Application Data

(60) Provisional application No. 62/995,120, filed on Jan. 14, 2020.

(51) Int. Cl.
*E04H 9/14* (2006.01)
*E04B 1/32* (2006.01)
*H02S 20/22* (2014.01)
*H01L 35/32* (2006.01)
*E04H 3/00* (2006.01)

(52) U.S. Cl.
CPC ............... *E04H 9/14* (2013.01); *E04B 1/32* (2013.01); *E04H 3/00* (2013.01); *H01L 35/32* (2013.01); *H02S 20/22* (2014.12)

(58) Field of Classification Search
CPC . E04B 1/32; H01L 35/32; H02S 20/22; B64G 9/00; E04H 9/14; E04H 3/00
See application file for complete search history.

(56) References Cited

PUBLICATIONS

Matt Williams, Feb. 12, 2019, Build Moon Bases in Craters.pdf (Year: 2019).*
Elizabeth Gibney, Oct. 24, 2018, How to build a Moon base (Year: 2018).*

* cited by examiner

*Primary Examiner* — Babajide A Demuren
(74) *Attorney, Agent, or Firm* — Wenderoth, Lind & Ponack, L.L.P.

(57) ABSTRACT

A structure, system, and method directed to building dwellings, shopping areas, government offices, towns, factories, hospitals and the like on the moon. The structure, system, and method utilize horizontal hole cavities on the moon such that dwellings, shopping areas, factories, government offices, towns, unmanned robot devices, and the like are placed in the horizontal hole cavities where cosmic rays and ultraviolet are not directly incident. Additionally, vertical hole cavities are utilized for building elevators and stairs. In addition, pipes supplying oxygen produced by photosynthesis devices on the moon's surface and carbon dioxide produced by humans in the cavity are used as conduits.

8 Claims, 3 Drawing Sheets

STRUCTURES AND METHODS FOR LUNAR UTILIZATION

TECHNICAL FIELD

The present invention pertains to utilization of the moon.

BACKGROUND ART

The surface of the moon has an atmosphere which is less than approximately 100 trillionth the density of the earth's atmosphere over the sea surface, and is clearly a brutal part of space, constantly exposed to collisions with micrometeors, ultraviolet, X rays, and other forms of cosmic rays.

Recently Elon Musk has been planning private moon travel, but [the problem of] how to live on the moon has not yet been solved.

SUMMARY OF THE INVENTION

Problem the Invention Seeks to Solve

It has been published that the JAXA (Japan Aerospace Exploration Agency) satellite Kaguya discovered the presence of a naturally formed underground cave 3 on the moon 1, having a vertical hole 2 with a diameter and depth of several tens of meters, and a horizontal hole of several tens of kilometers, as shown in FIGS. 1 and 2.

(1) The published literature does not describe any practical proposals for how specifically to utilize the moon.

(2) There is no published literature regarding concrete provision of dwellings, hospitals, factories, towns, cities, or the like on the moon.

(3) There is no published literature regarding [activities] performed on the moon which cannot be performed on earth.

(4) The object of the present invention is to provide for utilization of the moon, such as by supplying energy from the moon to the earth.

The moon is not suited as a living environment due to large quantities of radiation, cosmic rays, ultraviolet, and falling meteors 8.

The present invention was undertaken in light of these circumstances and has the object of providing a system for building dwellings, shopping areas, government offices, towns, factories, hospitals and the like on the moon, and contributing to the earth.

Means for Resolving the Problem

There are four types of hole on the moon: holes known as craters, various horizontal holes, various vertical holes, and horizontal holes with vertical holes; of these four types, a horizontal hole with a vertical hole would be used, such that an elevator and stairway are erected facing the bottom surface of the horizontal hole in the vertical hole portion, and a blocking panel is placed at the opening portion of the vertical hole at the top of the elevator and stairway so that cosmic rays, ultraviolet, and the like cannot penetrate; furthermore penetration of the thin ceiling portion of the horizontal hole can be prevented by solar panels or the like.

By utilizing horizontal hole cavities on the moon, dwellings, shopping areas, factories, hospitals, government agencies, towns, or unmanned robot devices can be provided in a horizontal hole where meteors, cosmic rays, ultraviolet radiation, and the like cannot directly impinge, and by using vertical holes, elevators and stairways can be erected to facilitate movement between the moon's surface and underground, while said elevators and stairways can be used as conduits for oxygen produced by oxygen-producing photosynthesis devices on the moon's surface and carbon dioxide produced by humans in the cavity, whereby a protective body is erected at the top of elevators and stairways so that meteors, cosmic rays, ultraviolet radiation, and the like do not penetrate from the opening portion of the vertical hole, with electrical generating elements using sunlight, earthlight, temperature differentials and the like provided on the roof portion of the horizontal hole as a protective body against meteors, cosmic rays, ultraviolet radiation, and the like.

As shown in FIG. 3, the present invention provides a stairway 4 or elevator 5 in a vertical hole 2 opened in a moon surface 1a. Cosmic rays and the like 8 can be prevented from reaching the bottom of the stairway by using a material which blocks cosmic rays and the like 8 for the treads of stairway 4, thereby creating a space that humans can use. This is an example embodiment of the invention wherein blocking of cosmic rays and the like 8 at moon surface 1a enables dwellings, shopping areas, factories, government offices, towns, etc. 6 to be erected in an underground cavity 3.

Due to the low gravity and virtual absence of atmosphere on the moon, chemical synthesis and [medical] treatment methods and the like not possible on earth can be performed in factories 6 or hospitals [on the moon], therefore the effect of the present invention is tremendous.

FIG. 4 shows a second embodiment of the invention; a roof-shaped cosmic ray protection panel 9 for blocking radiation or meteors 8 and the like is placed above elevator 5 and stairway 4 disposed in a vertical hole 2 in the moon. Light can be obtained not only from the sun but also the earth, so this [panel] may also be used to generate electrical energy for use on the moon by making it a solar and earthlight electric generating panel.

As with the vertical hole protection panel 9, a horizontal hole top portion protective panel 10 for preventing the penetration of cosmic rays and the like 8 into cavity 6 is erected above the horizontal hole 6 in the moon.

Of course, the protective panels 9 and 10 are included in the present invention even if not disposed.

11 is an entrance to a stairway. Stairway 4 may be a spiral stairway or half-turn stairway; 12 is an elevator external entrance/exit, 13 is an elevator car, and 14 is an elevator cavity internal entrance/exit.

FIG. 5 is a top view of FIG. 4.

The case in which a panel is used as a solar and earthlight panel only or as a cosmic ray and the like protection panel only, rather than [one panel] serving as both the solar panel and the cosmic ray, etc. protection panel, is also included in the present invention.

Since temperature differentials are severe on the moon, generating systems on the moon which utilize temperature differentials, and the systems for same, are also included in the present invention.

Electrical power obtained by generation using sunlight or earthlight, or by temperature differentials, can be used not only on the moon, but also can be transmitted to the earth by a means such as microwaves to be used as a power source for earth; this is also included in the invention.

Constituent parts used on the moon in the present invention make use of an irradiated part exposed to cosmic rays, radiation, and the like, and a non-irradiated part not exposed to radiation or the like, and include towns and the like 6 and hospitals and the like 7 in the non-irradiated part.

Utilizing a moon structure comprising a naturally present horizontal hole cavity 3 underground on moon 1, and a naturally present vertical hole 2 penetrating the horizontal hole 3 and moon surface 1a, infrastructures 6, 7 used by humans are erected in the horizontal hole cavity 3, such that the moon can be further utilized by these items.

Movement portions such as stairways or elevators are also placed in a vertical hole connected to a horizontal hole so that movement between the surface and underground portions can be easily accomplished when utilizing the moon's surface.

The simplest structure for the movement portion may be made by creating stair step panels for the stairway 4 in FIG. 3 from a material impervious to cosmic rays and the like 8, creating a zone underneath same where cosmic rays and the like 8 do not impinge. In addition to straight stairs, half-turn stairways or spiral stairways are also included in the present invention.

A factory 6 or hospital 7 erected in the aforementioned horizontal hole can take advantage of the moon's ⅙th earth gravity to perform manufacturing, treatment of patient feet or lower backs, various rehabilitation, or chemotherapy which cannot be accomplished on earth.

Another feature is the provision of energy producing means utilizing impinging light or temperature differentials at a position above parts 6 or 7 where humans can live, disposed in a vertical hole naturally formed in moon 1, or at other desired positions.

In a third embodiment of the invention, the FIG. 5 solar panel or temperature differential electric generating element 10 is further extended around the entire perimeter of the moon (not shown) so as to transmit energy 24 hours a day to the moon and the earth.

In a fourth embodiment of the invention, the temperature differential on the moon's surface is used as described above and a temperature differential electric generating device (not shown) is disposed at a position where incident light such as sunlight impinges, and at a position where incident light such as sunlight does not impinge.

In a fifth embodiment of the invention, the moon's surface shape, such as the perimeter surface of a crater, is utilized, with both a high temperature portion which receives sunlight and a low temperature portion which does not receive sunlight.

In a sixth embodiment of the invention, incident light energy producing means or temperature differential energy producing means are disposed at a position where earthlight or sunlight is incident, and at a position where earthlight or sunlight is not incident (not shown).

In a seventh embodiment of the invention, experiments with small organisms, microorganisms, viruses and the like present on earth are conducted in a hospital or research lab 7 in an [underground] cavity.

In an eighth embodiment of the invention, solar panels or temperature differential panels shown in FIGS. 4 and 5 are wrapped around the entire perimeter of the moon so that power can be produced in any position on the moon and energy can be obtained for the moon or earth.

Effect of the Invention

With the present invention, dwellings, towns, factories, and hospitals can be built without fear of cosmic rays or ultraviolet, which was previously impossible, so that humanity can live securely on the moon. Problems of overpopulation on earth can also be solved by moving to the moon. Health advantages are conferred by the ability to cure illnesses uncurable on earth. Research can be done on chemical reactions which cannot be performed on earth. New production and industries can also be started as a result. There are also enormous effects from the present invention such as supplying energy to the earth and supplementing the earth's energy shortages, without that energy polluting the earth environment.

A concrete science-based invention such as the present application is novel and cannot be easily attained by a person of ordinary skill in the art, and the effects rendered by the inventions of the Claims cannot be anticipated by a person of ordinary skill in the art.

EMBODIMENTS OF THE INVENTION

Figure 1:
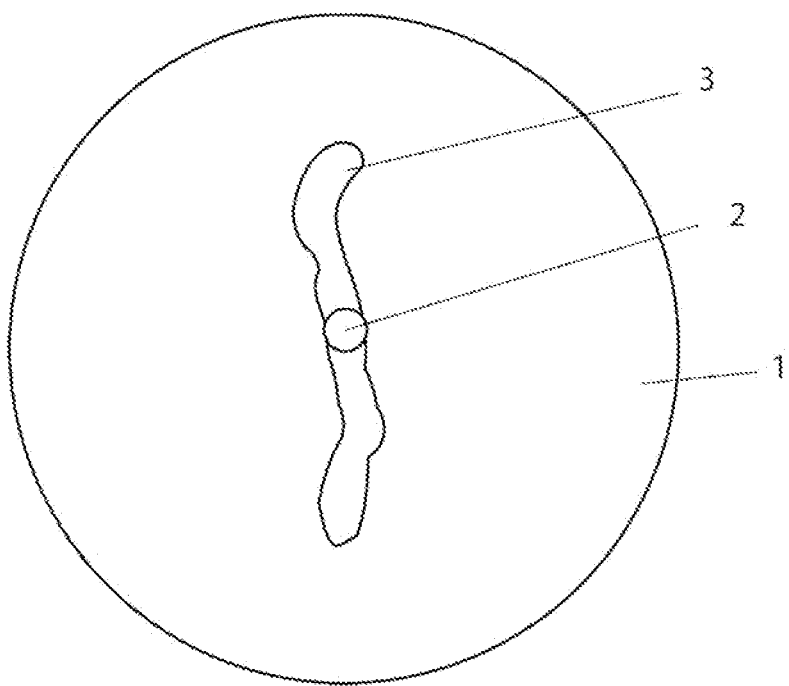
FIG. 1 Diagram showing a newly discovered vertical hole 2 present in the surface of the moon and hole cavity 3 present under the surface of the moon.
Figure 2:
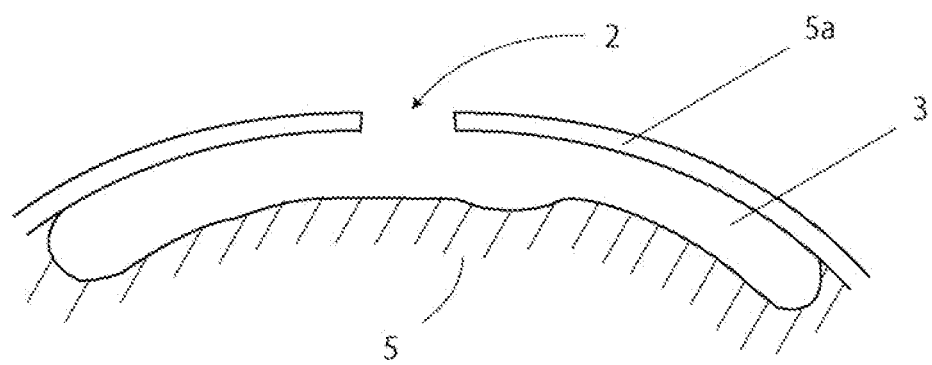
FIG. 2 Horizontal cross section of the moon in FIG. 1.
Figure 3:
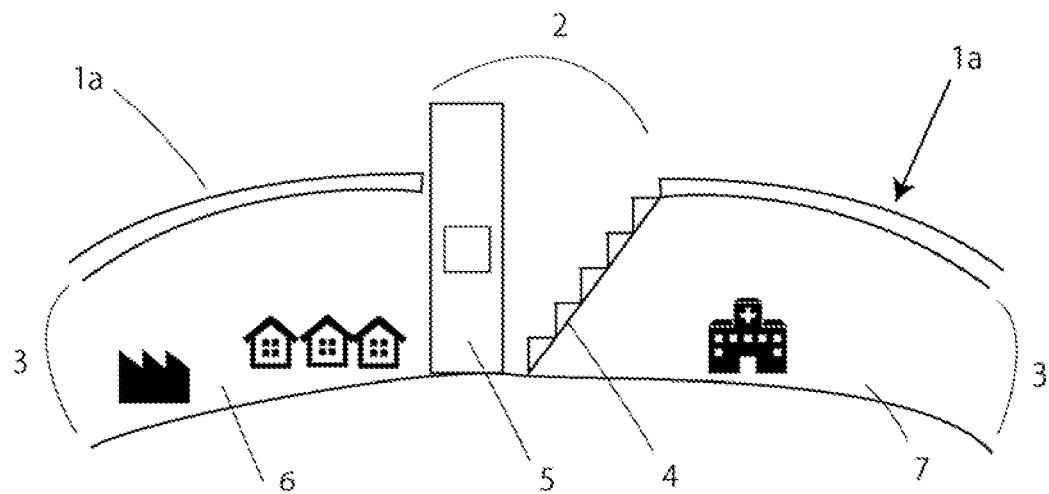
FIG. 3 Cross section of the moon in the first embodiment of the invention.
Figure 4:
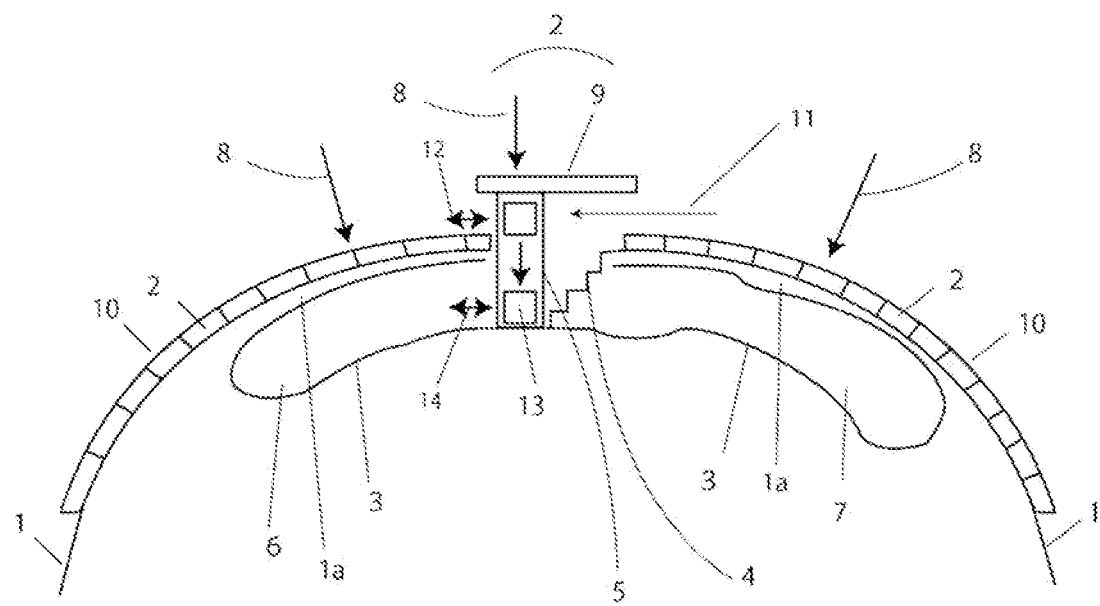
FIG. 4 Cross section of the second embodiment of the invention.
Figure 5:
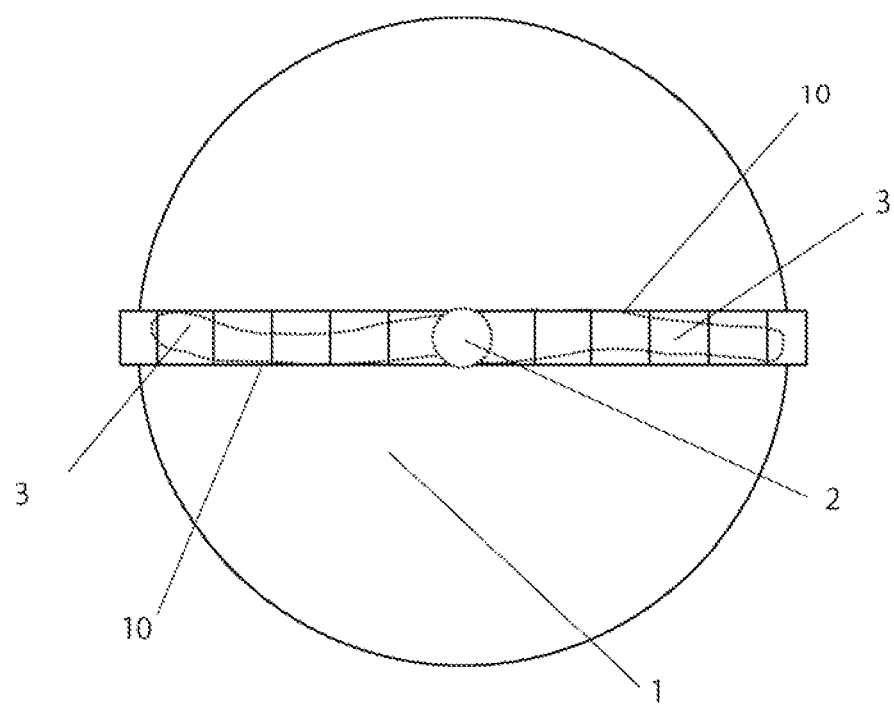
FIG. 5 Top view of FIG. 4.

As explained in detail in "Means for Resolving Problems" above. I.e., FIGS. 3, 4, and 5 are embodiments of the invention.

As shown in this figure, the present invention provides dwelling facilities using vertical holes and horizontal holes on the moon.

Specifically, movement portions such as stairways or elevators are provided in a vertical hole.

This enables movement between the surface and subsurface of the moon.

Dwellings, towns, farmland, ponds, factories, government agencies, hospitals, and the like are provided in horizontal holes.

I.e., cavity portions, being non-incident portions (portions not [receiving] direct light), are considered dwelling spaces.

This enables people to live securely without exposure to radiation or the like.

Because movement portions such as stairways or elevators are disposed in vertical holes connected to horizontal holes, movement between the surface and underground can be easily accomplished when performing activities on the moon's surface.

Roads may also be provided and used for movement.

Other aspects are described in detail in "Means for Solving Problems."

Oxygen for human habitation is supplied to a pipe [shaped] cavity 3 through a vertical hole 2 by providing a hothouse-shaped box on the moon's surface, into which plants are introduced and oxygen is produced by photosynthesis using sunlight, earthlight, or cosmic energy. Carbon dioxide produced by humans in the cavity 3 is fed by a pipe to that hothouse on the moon's surface through a vertical hole 2, and oxygen from photosynthesis by the plants therein is supplied by pipe through a vertical hole to the cavity 3 where humans are present.

Water will either be discovered by exploration of the moon, or produced by combining hydrogen and oxygen. Even if this cannot be done, an unmanned arrangement can be made of everything installed in cavity 6, with work performed by robots, and electrical power for same coming from the aforementioned lunar energy generating devices. The above is known art and is therefore not illustrated.

In addition, the present invention includes the provision of a takeoff/landing site utilizing vertical hole 2 on the moon for transport vehicles (e.g., rocket [driven] space ships, airplane-type shuttles, and the like). This enables humans disembarking from a transport vehicle on the moon to reach the horizontal hole containing a residential area without being exposed to the degraded environment of the moon's surface. In addition, a vertical hole can be even more effectively utilized by sealing off the moon surface part of the vertical hole where a landing/launching site is placed using the aforementioned solar panel or cosmic ray protection panel.

Transport vehicles may also be used to transport energy. Included as energy is the transport to the earth of energy in the form of solid hydrogen fuel for electrical power.

POTENTIAL FOR INDUSTRIAL UTILIZATION

Other aspects of the present invention are described in detail in "Means for Solving Problems." Things which cannot be done on earth can be done [on the moon], the moon can be effectively used, and industrial applications such as providing energy from the moon to the earth are extensive.

EXPLANATION OF REFERENCE NUMERALS

1: Moon
1a: Moon surface
2: Moon vertical hole
3: Moon horizontal hole
4: Stairway
5: Elevator
6: Dwellings, shopping areas, factories, government offices, towns, etc.
7: Hospitals and the like
8: Radiation, meteors, etc.
9: Vertical hole top portion cosmic ray protection panel (also usable for solar electric generation)
10: Vertical hole top portion cosmic ray protection panel (also usable for solar electric generation and temperature differential electric generation)
11: Stairway entrance
12: Elevator external entrance/exit
13: Elevator car
14: Elevator cavity interior entrance/exit

The invention claimed is:

1. A moon utilization structure for utilizing a vertical hole on the surface of the moon to access a horizontal hole cavity under the surface of the moon, comprising:
elevators and stairs provided in the vertical hole to facilitate movement between the moon surface and horizontal hole cavity; and
photosynthesis devices provided on the surface of the moon and pipes provided within the horizontal hole cavity for supplying oxygen and eliminating carbon dioxide within the horizontal hole cavity,
wherein the horizontal hole cavity is used for constructing dwellings, shopping areas, factories, hospitals, government offices, towns, and for using unmanned robot devices where cosmic and ultraviolet rays cannot penetrate.

2. A moon utilization method comprising:
utilizing a vertical hole on the surface of the moon to access a horizontal hole cavity under the surface of the moon;
providing elevators and stairs in the vertical hole to facilitate movement between the moon surface and the horizontal hole cavity; and
providing photosynthesis devices on the surface of the moon and pipes within the horizontal hole cavity for supplying oxygen and eliminating carbon dioxide within the horizontal hole cavity,
wherein the horizontal hole cavity is used for constructing dwellings, shopping areas, factories, hospitals, government offices, towns, and for using unmanned robot devices where cosmic and ultraviolet rays cannot penetrate.

3. A moon utilization structure of claim 1, further comprising a protective body placed above the vertical hole for protection from meteors or cosmic rays.

4. A moon utilization structure of claim 3, wherein the protective body is an electrical generation element using sunlight, earthlight, or temperature differentials to generate electrical energy.

5. A moon utilization structure of claim 4, wherein the electrical energy is generated on the moon and transmitted to the earth to be used as energy on earth.

6. A moon utilization structure of claim 1, wherein differences between the moon and earth's gravity, oxygen concentration, and atmosphere are utilized to implement chemical reactions, medicines, industry, and for gathering data for living in locations other than on the earth.

7. A moon utilization structure for utilizing a vertical hole on the surface of the moon to access a horizontal hole cavity under the surface of the moon, comprising:
elevators and stairs provided in the vertical hole to facilitate movement between the moon surface and horizontal hole cavity;
photosynthesis devices provided on the surface of the moon and pipes provided within the horizontal hole cavity for supplying oxygen and eliminating carbon dioxide within the horizontal hole cavity; and
a protective body provided at a top portion of the elevator or stairway so that meteors, cosmic or ultraviolet rays cannot penetrate from an opening portion of the vertical hole,
wherein the horizontal hole cavity is used for constructing dwellings, shopping areas, factories, hospitals, government offices, towns, and for using unmanned robot devices where cosmic and ultraviolet rays cannot penetrate, and
an electric generating element is provided as the protective body.

8. A moon utilization structure of claim 3, wherein the elevators and stairs are erected facing a bottom surface of the horizontal hole cavity and extending in the vertical hole, and
the protective body includes a blocking panel placed at the opening of the vertical hole at a top portion of the elevator and stairway to block the cosmic and ultraviolet rays.

* * * * *